(12) United States Patent
Li

(10) Patent No.: US 9,015,429 B2
(45) Date of Patent: Apr. 21, 2015

(54) METHOD AND APPARATUS FOR AN EFFICIENT HARDWARE IMPLEMENTATION OF DICTIONARY BASED LOSSLESS COMPRESSION

(71) Applicant: Xerox Corporation, Norwalk, CT (US)

(72) Inventor: Xing Li, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 211 days.

(21) Appl. No.: 13/865,823

(22) Filed: Apr. 18, 2013

(65) Prior Publication Data

US 2014/0317345 A1 Oct. 23, 2014

(51) Int. Cl.
*G06F 12/12* (2006.01)
*G11C 7/10* (2006.01)
*G06F 12/02* (2006.01)
*H03M 7/30* (2006.01)
*G06F 3/06* (2006.01)

(52) U.S. Cl.
CPC .......... *G11C 7/1036* (2013.01); *G06F 12/0292* (2013.01); *H03M 7/30* (2013.01); *G06F 3/0605* (2013.01); *G06F 3/067* (2013.01)

(58) Field of Classification Search
CPC ... G06F 3/067; G06F 3/0605; G06F 12/0292; H03M 7/30; G11C 7/1036
USPC .......................................................... 711/154
See application file for complete search history.

(56) References Cited

U.S. PATENT DOCUMENTS

| 5,481,694 A | * | 1/1996 | Chao et al. ..................... 711/112 |
| 2001/0000314 A1 | * | 4/2001 | Queiroz et al. ................ 382/264 |
| 2003/0212719 A1 | * | 11/2003 | Yasuda et al. ................. 707/206 |
| 2008/0320224 A1 | * | 12/2008 | Kiyota .......................... 711/122 |

* cited by examiner

*Primary Examiner* — Jae Yu

(57) ABSTRACT

A method, computer readable medium, and apparatus for implementing a compression are disclosed. For example, the method receives a first portion of an input data at a first register, determines a first address based upon the first portion of the input data, reads the first address in a memory to determine if a value stored in the first address is zero, stores a code for the first address of the memory in the first register if the value of the first address is zero, receives a second portion of the input data at a second register, determines a second address based upon the second portion of the input data in the memory, obtains the code from the first register if the second address and the first address are the same and writes the code from the first register in the first address of the memory.

20 Claims, 4 Drawing Sheets

METHOD AND APPARATUS FOR AN EFFICIENT HARDWARE IMPLEMENTATION OF DICTIONARY BASED LOSSLESS COMPRESSION

The present disclosure relates generally to compression methods and, more particularly, to a method and an apparatus for an efficient hardware implementation of dictionary based lossless compression.

BACKGROUND

One of the difficulties in hardware implementation of some compression algorithms is memory access and reset. In a high data rate system in which output is generated in parallel, it may be a challenge to run the compression algorithm at a high speed or rate in a deterministic way. In previous methods, the input data would be compared to every address location of a memory to determine if the sequence of the input data was previously seen. As a result, performing the dictionary based compression was process intensive and inefficient.

SUMMARY

According to aspects illustrated herein, there are provided a method, a non-transitory computer readable medium, and an apparatus for implementing a compression. One disclosed feature of the embodiments is a method that receives a first portion of an input data at a first register, determines a first address based upon the first portion of the input data, reads the first address in a memory to determine if a value stored in the first address is zero, stores a code for the first address of the memory in the first register if the value of the first address is zero, receives a second portion of the input data at a second register, determines a second address based upon the second portion of the input data in the memory, obtains the code from the first register if the second address and the first address are the same and writes the code from the first register in the first address of the memory.

Another disclosed feature of the embodiments is a non-transitory computer-readable medium having stored thereon a plurality of instructions, the plurality of instructions including instructions which, when executed by a processor, cause the processor to perform operations that receive a first portion of an input data at a first register, determine a first address based upon the first portion of the input data, reads the first address in a memory to determine if a value stored in the first address is zero, store a code for the first address of the memory in the first register if the value of the first address is zero, receive a second portion of the input data at a second register, determine a second address based upon the second portion of the input data in the memory, obtain the code from the first register if the second address and the first address are the same and write the code from the first register in the first address of the memory.

Another disclosed feature of the embodiments is an apparatus comprising a processor that is configured to receive a first portion of an input data at a first register, determine a first address based upon the first portion of the input data, read the first address in a memory to determine if a value stored in the first address is zero, store a code for the first address of the memory in the first register if the value of the first address is zero, receive a second portion of the input data at a second register, determine a second address based upon the second portion of the input data in the memory, obtain the code from the first register if the second address and the first address are the same and write the code from the first register in the first address of the memory.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly discloses a method and non-transitory computer readable medium for implementing an efficient dictionary based lossless compression. As discussed above, one of the difficulties in hardware implementation of some compression algorithms is memory access and reset. In a high data rate system in which output is generated in parallel, it may be a challenge to run the compression algorithm at a high speed or rate in a deterministic way. In previous methods, the input data would be compared to every address location of a memory to determine if the sequence of the input data was previously seen. As a result, performing the dictionary based compression was process intensive and inefficient.

One embodiment of the present disclosure provides a method that separates a read operation and a write operation to a same memory location into different clock cycles. Said another way, one embodiment of the present disclosure does not require that the read operation and write operation occur in the same clock cycle at the same memory location. As a result, the dictionary based compression algorithm may run more efficiently.

In addition, one embodiment of the present disclosure may use one or more flag tables to reduce the amount of memory required to perform the dictionary based compression algorithm. For example, one or more flag tables may be deployed to reduce the number of bits that need to be analyzed for each read operation.

In addition, two flag tables may be deployed to provide "ping-ponging" to allow the dictionary based compression algorithm to run continuously as one flag table is used while the other flag table resets during operation. Moreover, since the flag tables are single bit memory tables, this reduces the amount of memory used compared to deploying two full code tables that can be 8 bits or greater per line.

Figure 1:
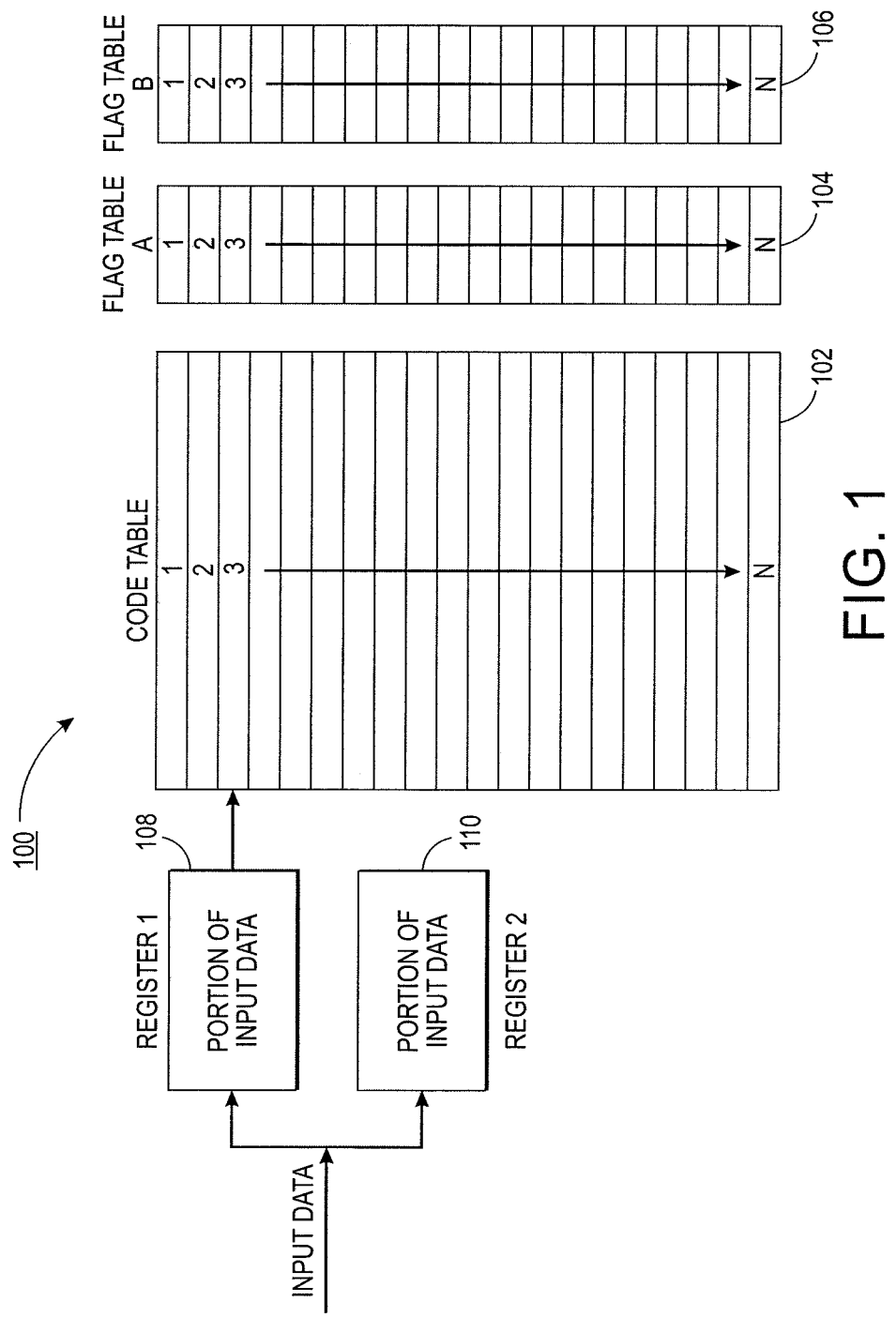
FIG. 1 illustrates an example system for implementing an efficient dictionary based lossless compression.

To better understand the present disclosure, FIG. 1 illustrates an example system 100 for implementing an efficient dictionary based lossless compression. In one embodiment, the lossless based compression algorithm may be a Lempel-Ziv-Welch (LZW) compression algorithm and the like.

In one embodiment, the system 100 may be deployed as computer readable memory as part of a general purpose computer as described in FIG. 4 and discussed below. In one embodiment, the system 100 may be part of a digital front end (DFE) or a marking engine used for processing images on a high resolution printer or multifunction device.

In one embodiment, the system 100 may include a code table 102 and optionally, a flag table 104 and/or a flag table 106. In one embodiment, the system 100 may also include a first register 108 and a second register 110 that receives portions of an input data stream. In one embodiment, the code table 102, the flag tables 104 and 106, the first register 108 and the second register 110 may be part of a single physical computer readable medium within a computing device (e.g., a computer) that is partitioned to separate each one of the code table 102, the flag tables 104 and 106, the first register 108 and the second register 110. In another embodiment, the code table 102, the flag tables 104 and 106, the first register 108 and the second register 110 may be deployed as one or more physically separate computer readable mediums within a computer.

In one embodiment, the portions of the input data stream may be, for example, a nibble (i.e., a 4-bit portion of the input data stream). In one embodiment, the input data stream may be image data. For example, the input data stream may be a color channel of a plurality of color channels that are being processed by the system 100 for performing an efficient dictionary based lossless compression. In one embodiment, the system 100 may be part of a larger system that is used to produce an image for printing.

In one embodiment, the code table 102, the flag table 104 and the flag table 106 may have a plurality of lines 1 to N. In addition, each one of the plurality of lines 1 to N may have a unique address. In one embodiment, the code table 102 may have a plurality of bits per line (e.g., 8 bits per line). In one embodiment, the flag table 104 and the flag table 106 may have a single bit per line (e.g., 1 bit per line).

In one embodiment, a first portion of the input data stream may be stored in a first register 108 and used to determine an address of the memory (e.g., the code table 102, the flag table 104 or the flag table 106). For example, if the input data stream is a stream of binary numbers, and a 4-bit nibble is analyzed, e.g., 1001, the 4-bit nibble 1001 may point to line 1001 in the memory.

In other words, unlike prior methods that compare the data to each line in a code table to determine if the pattern in the data has been seen before or if the data is a new pattern and uses the address as an output, the present disclosure uses the first portion of the input data stream as the address and uses the content or value stored at the address as the output. As a result, each line of the memory (e.g., the code table 102, the flag table 104 or the flag table 106) does not need to be read. Rather, one embodiment of the present disclosure only needs to read the content or a value of the memory at the address determined by the first portion of the input data stream.

In one embodiment, a value of zero may mean that the portion of the input data stream that is received is new. As a result, if the value in the memory is zero, then a new unique code can be assigned to the address determined by the first portion of the input data stream and stored in the first register 108. However, the new unique code does not need to be written into the address location during the same clock cycle.

In a subsequent clock cycle, a second portion of the input data stream may be stored in a second register 110. The second portion of the input data stream may be used to determine an address of the memory. If the address of the second portion of the input data stream is identical or the same as the address of the first portion of the input data stream, then the output may be the code currently stored in the first register 108.

In addition, the code may then be written to the address in the memory. In other words, in the subsequent clock cycle, the same memory location was not read, but only written to with the new unique code that was assigned in the previous clock cycle. The second register 110 was able to obtain the proper code from the first register 108 since the addresses of the portions of the input data stream were the same. Notably, the memory location associated with the address did not have to be accessed such that a read operation in addition to the write operation had to be performed during the same clock cycle.

As a result, the present disclosure provides an efficient method for dictionary based lossless compression. A more detailed description of the method is discussed below with reference to FIGS. 2 and 3.

Figure 2:
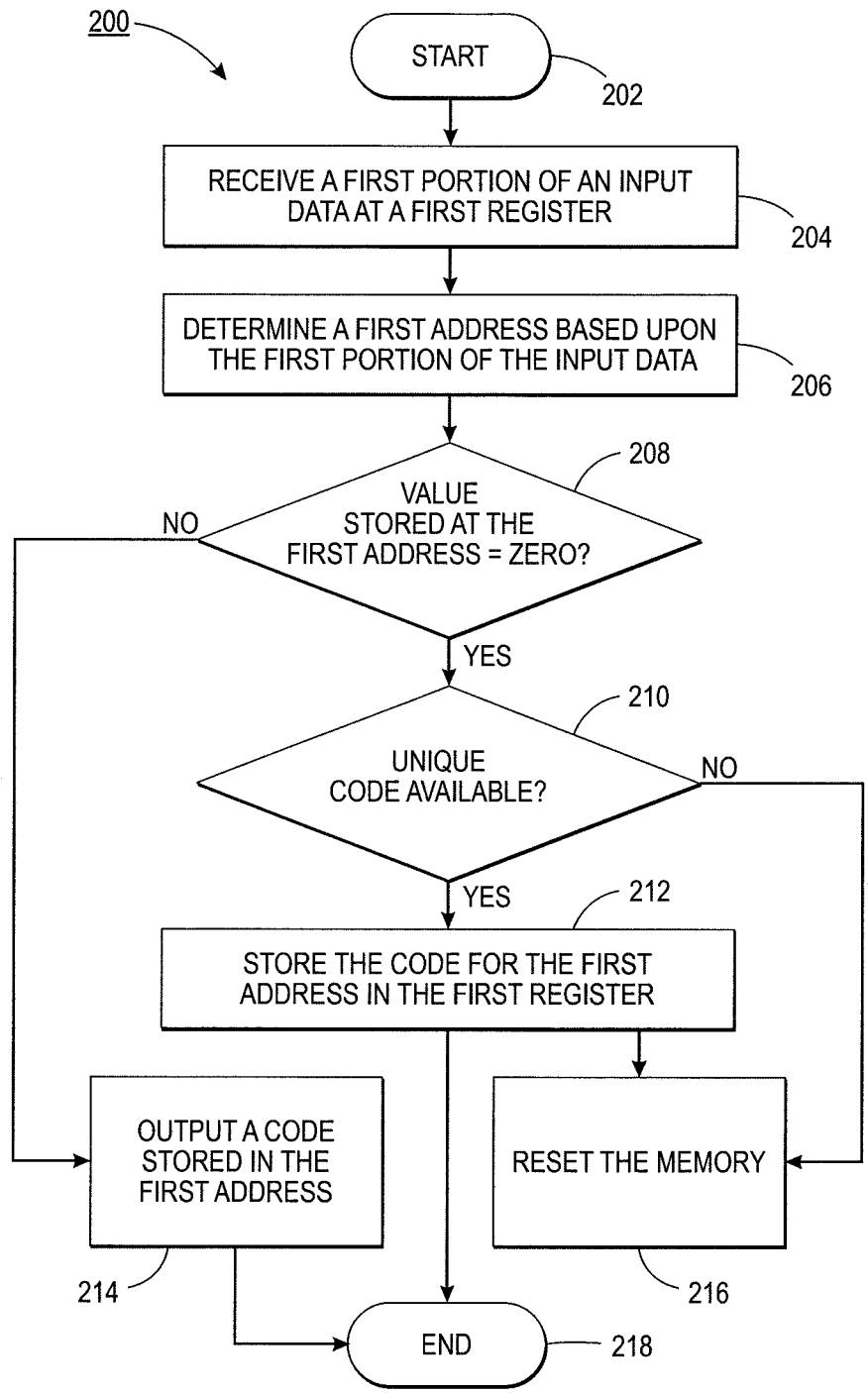
FIG. 2 illustrates an example flowchart of one embodiment of a first clock cycle of a method for implementing an efficient dictionary based lossless compression.

FIG. 2 illustrates a flowchart of a method 200 for implementing an efficient dictionary based lossless compression during a first clock cycle. In one embodiment, the method 200 may be performed by a general-purpose computer as illustrated in FIG. 4 and discussed below. As indicated below, a general-purpose computer may be broadly interpreted to include a field programmable gate array (FPGA) or an application specific integrated circuit (ASIC). In one embodiment, the general purpose computer may be part of a DFE or marking engine.

The method 200 begins at step 202. At step 204, the method 200 receives a first portion of an input data at a first register. In one embodiment, the input data may be image data from an input data stream. For example, the input data may be a color channel of a plurality of color channels that are being processed to produce an image for printing.

At step 206, the method 200 determines a first address based upon the first portion of the input data. For example, if the input data is a stream of binary numbers, and a 4-bit nibble is analyzed, e.g., 1001, the 4-bit nibble 1001 may point to line 1001 in the memory.

At step 208, the method 200 determines if a value stored at the first address is equal to zero. In one embodiment, which memory table is checked may be determined based upon which embodiment of the present disclosure is used. For example, in one embodiment, only a code table may be needed. Thus, the address may be pointing to a line of the code table and the line may be checked to see if the value at the line of the code table is equal to zero.

In a second embodiment, a code table and a single flag table may be needed. Thus, the address may be pointing to a line of the flag table and check to see if the value at the line of the flag table is zero.

In a third embodiment, a code table and two flag tables may be needed. For example, the two flag tables may be used such that a first flag table may be used while a second flag table is being reset and vice versa. Thus, if the first flag table is being used, the address may be pointing to a line of the first flag table and the line of the first flag table may be checked to see if the value is zero. Conversely, if the second flag table is being used, while the first flag table is being reset, the address may be pointing to a line of the second flag table and the line of the second flag table may be checked to see if the value is zero.

If the value stored at the first address in not equal to zero, the method 200 may proceed to step 214. At step 214, the method 200 outputs a code stored in the first address. For example, if the value stored at the first address is not equal to zero, this means that the pattern of the first portion of data has already been seen during the compression. As a result, code in the line of the first address of the memory may be provided.

In one embodiment, if only the code table is being used, the non-zero value would include the code that is provided as the output. In another embodiment, if one or more flag tables are used, the non-zero value would be a value of "1" since the flag tables are 1-bit per line tables. After seeing a value of "1", the system would know that the pattern of the first portion of the input data was previously seen and obtain the code from the line indicated by the first address from the code table. In one embodiment, the flag tables may be used to improve the processing efficiency due to the fact that only a single bit is read versus many more bits (e.g., 8 bits, 24 bits, etc.) possibly in the code table. The method 200 proceeds to step 218.

Referring back to step 208, if the method 200 determines that the value stored at the first address is equal to zero, the method 200 proceeds to step 210. In other words, the pattern of the first portion of the input data is new and a new code must be assigned to the pattern and stored in the line indicated by the first address.

At step 210, the method 200 determines if a unique code is available. For example, a next code counter parameter may be tracked while the method 200 is performed. The next code counter parameter may have max value equivalent to the number of unique combinations of the number of bits per line of the code table. For example, if the code table uses 8 bits per line, there may be 256 unique codes available. As a result, if the next code counter parameter has a value equal to or greater than a maximum value (e.g., 256 for 8-bits per line) that may indicate that no unique code is available. However, if the next code counter parameter has a value less than the maximum value that may indicate that a unique code is available.

At step 210, if no unique code is available (e.g., the next code counter is at a maximum value), then the method 200 proceeds to step 216. At step 216, the method 200 resets the memory. For example, if only a code table is used as the memory, then all of the stored codes in each line of the code table is reset to a value of zero. In another embodiment, if one or more flag tables are used as the memory in addition to the code table, then each line of the flag table may have a stored value reset to a value of zero. The method 200 then proceeds to step 212.

Referring back to step 210, if a unique code is available, then the method 200 may proceed to step 212. At step 212, the method 200 stores the assigned code for the first address of the memory in the first register.

Notably, during the first clock cycle of the method 200 the line of the memory indicated by the first address determined by the first portion of the input data has only been read. No data was written to the same memory location during the first clock cycle. In other words, only a single read operation was performed on a line of the memory and not both a read operation and a write operation on the same line of the memory. The method 200 ends at step 212.

Figure 3:
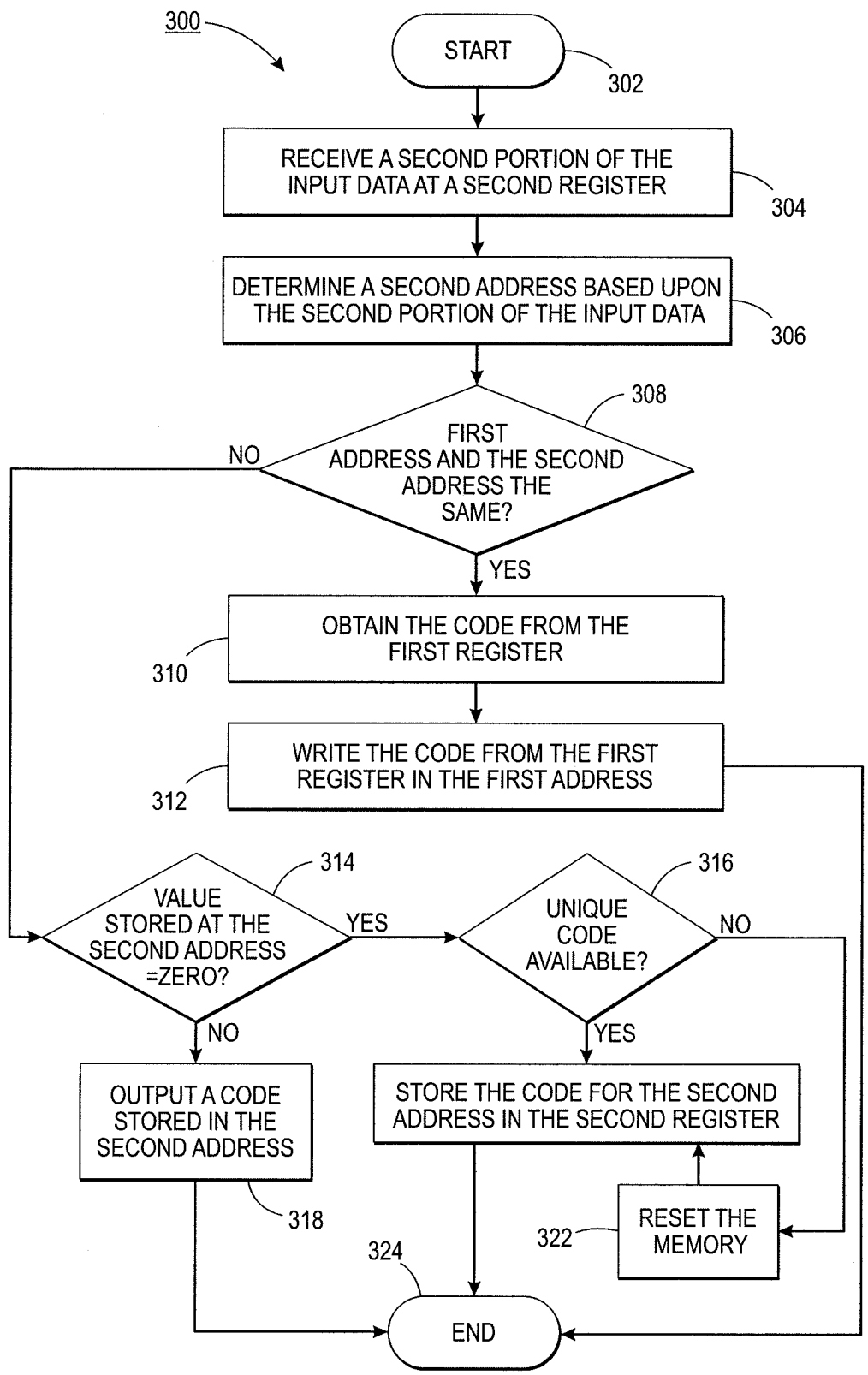
FIG. 3 illustrates an example flowchart of one embodiment of a second clock cycle of a method for implementing an efficient dictionary based lossless compression.

FIG. 3 illustrates a flowchart of a method 300 for implementing an efficient dictionary based lossless compression. In one embodiment, the method 300 may be performed in the clock cycle immediately following the clock cycle of the method 200. In other words, the methods 200 and 300 may be read as being performed in consecutive clock cycles. In another embodiment, the method 300 may be performed immediately after any previous clock cycle (e.g., after a second clock cycle, a third clock cycle, and so forth).

Figure 4:
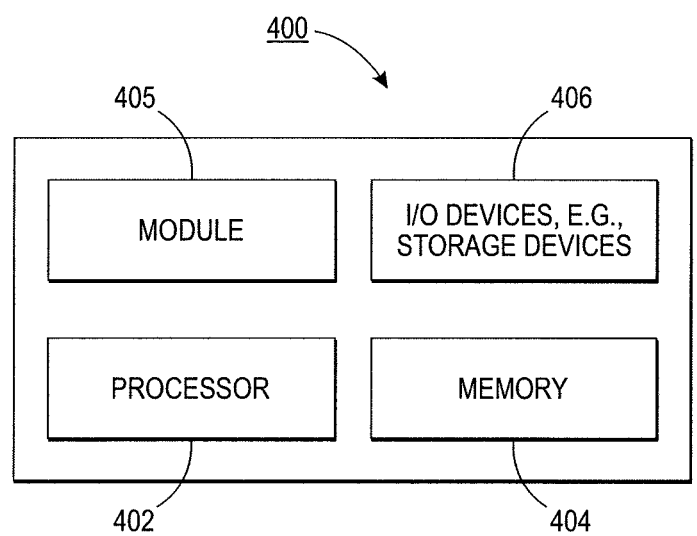
FIG. 4 illustrates a high-level block diagram of a general-purpose computer suitable for use in performing the functions described herein.

In one embodiment, the method 300 may be performed by a general-purpose computer as illustrated in FIG. 4 and discussed below. As indicated below, a general-purpose computer may be broadly interpreted to include a field programmable gate array (FPGA) or an application specific integrated circuit (ASIC). In one embodiment, the general purpose computer may be part of a DFE or marking engine.

The method 300 begins at step 302. At step 304, the method 300 receives a second portion of the input data at the second register. In one embodiment, the input data may be image data from an input data stream. For example, the input data may be a color channel of a plurality of color channels that are being processed to produce an image for printing.

At step 306, the method 300 determines a second address based upon the second portion of the input data. For example, if the input data is a stream of binary numbers, and a 4-bit nibble is analyzed, the 4-bit nibble may be translated to a number in decimal. For example, if the second portion of the input data is 1001, the second portion of the input data would point to line 9 in the memory.

At step 308, the method 300 determines if the first address and the second address are the same. If the first address and the second address are not the same, the method 300 proceeds to step 314.

At step 314, the method 300 determines if a value stored at the second address is equal to zero. In one embodiment, which memory table is checked may be determined based upon which embodiment of the present disclosure is used. For example, in one embodiment, only a code table may be needed. Thus, the address may be pointing to a line of the code table and the line may be checked to see if the value at the line of the code table is equal to zero.

In a second embodiment, a code table and a single flag table may be needed. Thus, the address may be pointing to a line of the flag table and check to see if the value at the line of the flag table is zero.

In a third embodiment, a code table and two flag tables may be needed. For example, the two flag tables may be used such that a first flag table may be used while a second flag table is being reset and vice versa. Thus, if the first flag table is being used, the address may be pointing to a line of the first flag table and the line of the first flag table may be checked to see if the value is zero. Conversely, if the second flag table is being used, while the first flag table is being reset, the address may be pointing to a line of the second flag table and the line of the second flag table may be checked to see if the value is zero.

If the value stored at the second address in not equal to zero, the method 300 may proceed to step 318. At step 318, the method 300 outputs a code stored in the second address. For example, if the value stored at the second address is not equal to zero, this means that the pattern of the second portion of data has already been seen during the compression. As a result, code in the line of the second address of the memory may be provided.

In one embodiment, if only the code table is being used, the non-zero value would include the code that is provided as the output. In another embodiment, if one or more flag tables are used, the non-zero value would be a value of "1" since the flag tables are 1-bit per line tables. After seeing a value of "1", the system would know that the pattern of the second portion of the input data was previously seen and obtain the code from the line indicated by the second address from the code table. In one embodiment, the flag tables may be used to improve the processing efficiency due to the fact that only a single bit is read versus many more bits (e.g., 8 bits, 24 bits, etc.) possibly in the code table. The method 300 proceeds to step 324.

Referring back to step 314, if the method 300 determines that the value stored at the second address is equal to zero, the method 300 proceeds to step 316. In other words, the pattern of the first portion of the input data is new and a new code must be assigned to the pattern and stored in the line indicated by the first address.

At step 316, the method determines if a unique code is available. For example, a next code counter parameter may be tracked while the method 300 is performed. The next code counter parameter may have max value equivalent to the number of unique combinations of the number of bits per line of the code table. For example, if the code table uses 8 bits per line, there may be 256 unique codes available. As a result, if the next code counter parameter has a value equal to or greater than a maximum value (e.g., 256 for 8-bits per line) that may indicate that no unique code is available. However, if the next code counter parameter has a value less than the maximum value that may indicate that a unique code is available.

At step 316, if no unique code is available (e.g., the next code counter is at a maximum value), then the method 300 proceeds to step 322. At step 322, the method 300 resets the memory. For example, if only a code table is used as the memory, then all of the stored codes in each line of the code table is reset to a value of zero. In another embodiment, if one or more flag tables are used as the memory in addition to the code table, then each line of the flag table may have a stored value reset to a value of zero. The method 300 then proceeds to step 320.

Referring back to step 316, if a unique code is available, then the method 300 may proceed to step 320. At step 320, the method 300 stores the assigned code for the second address of the memory in the second register. The method 300 then proceeds to step 324.

Referring back to step 308, if the first address and the second address are the same, the method 300 proceeds to step 310. At step 310, the method 300 obtains the code from the first register. For example, a yes at step 308 may mean that the same pattern was received in consecutive clock cycles. However, since the read operation and the write operation are not performed at the same memory location (i.e., same address) during a single clock cycle, the code was not written to the first address of the memory in the method 200.

In other words, during the first clock cycle the unique code that was assigned to the pattern of the first portion of the input, which is the same as the second portion of the input, was stored in the first register. However, the unique code was not written in the line of the memory during the first clock cycle. Thus, the unique code associated with the pattern of the second portion of the input data may be obtained from the first register and the address of the memory (which is both the first address and the second address since they are the same) does not have to be accessed to perform a read operation.

At step 312, the method 300 writes the code from the first register in the first address. For example, during the second clock cycle, the method 300 may write the code associated with the pattern of the first portion of the input data into a line of the code table associated with the first address. In one embodiment, if one or more flag tables are used, the method 300 may also write a value of "1" in the line of the flag table associated with the first address indicating that the pattern has been seen before.

In one embodiment, the first register and the second register may be swapped back and forth between consecutive clock cycles in methods 200 and 300. For example, if a third portion of the input data were received, the third portion would be stored in the first register, since the second register was used last in the method 300 and so forth. In addition, the method 300 may be repeated for each subsequent portion of the input data until no more input data remains for processing or compression. The method ends at step 324.

It should be noted that although not explicitly specified, one or more steps, functions, or operations of the methods 200 and 300 described above may include a storing, displaying and/or outputting step as required for a particular application. In other words, any data, records, fields, and/or intermediate results discussed in the methods can be stored, displayed, and/or outputted to another device as required for a particular application. Furthermore, steps, functions, or operations in FIGS. 2 and 3 that recite a determining operation, or involve a decision, do not necessarily require that both branches of the determining operation be practiced. In other words, one of the branches of the determining operation can be deemed as an optional step.

FIG. 4 depicts a high-level block diagram of a general-purpose computer suitable for use in performing the functions described herein. As depicted in FIG. 4, the system 400 comprises a processor element 402 (e.g., a CPU), a memory 404, e.g., random access memory (RAM) and/or read only memory (ROM), a module 405 for implementing an efficient dictionary based lossless compression, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that the present disclosure can be implemented in software and/or in a combination of software and hardware, e.g., using application specific integrated circuits (ASIC), field programmable gate arrays (FPGA), a general purpose computer or any other hardware equivalents, e.g., computer readable instructions pertaining to the method(s) discussed above can be used to configure a hardware processor to perform the steps of the above disclosed methods. In one embodiment, the present module or process 405 for implementing an efficient dictionary based lossless compression can be loaded into memory 404 and executed by processor 402 to implement the functions as discussed above. As such, the present method 405 for implementing an efficient dictionary based lossless compression (including associated data structures) of the present disclosure can be stored on a non-transitory (e.g., physical and tangible) computer readable storage medium, e.g., RAM memory, magnetic or optical drive or diskette and the like. For example, the hardware processor 402 can be programmed or configured with instructions (e.g., computer readable instructions) to perform the steps, functions, or operations of methods 200 and 300.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for implementing a compression, comprising:
  receiving, by a processor, a first portion of an input data at a first register;
  determining, by the processor, a first address based upon the first portion of the input data;
  reading, by the processor, the first address in a memory to determine if a value stored in the first address is zero;
  storing, by the processor, a code for the first address of the memory in the first register if the value of the first address is zero;
  receiving, by the processor, a second portion of the input data at a second register;

determining, by the processor, a second address based upon the second portion of the input data;

obtaining, by the processor, the code from the first register if the second address and the first address are the same; and writing, by the processor, the code from the first register in the first address of the memory.

2. The method of claim 1, further comprising:

reading, by the processor, the second address in the memory to determine if a value stored in the second address is zero if the first address and the second address are different; and storing, by the processor, a new code for the second address of the memory in the second register if the value of the second address is zero.

3. The method of claim 1, wherein steps of the method are repeated until a number of unique codes exceeds a number of unique combinations based upon a number of bits of the memory.

4. The method of claim 3, comprising:

resetting, by the processor, each address of the memory to a value of zero when the number of unique codes exceeds the number of unique combinations based upon a number of bits of the memory and repeating the steps of the method.

5. The method of claim 3, comprising a first flag table and a second flag table, wherein each address of the first flag table and the second flag table comprises a single bit, wherein the first flag table and the second flag table are used to track whether an address of each portion of the input data that is received has been seen by a code table.

6. The method of claim 5, comprising:

using, by the processor, the first flag table for each portion of the input data that is received; and using, by the processor, the second flag table once the unique codes exceeds the number of unique combinations based upon a number of bits of the memory for each subsequent portion of the input data that is received while the first flag table is reset.

7. The method of claim 1, wherein each subsequent portion of the input data alternates between the first register and the second register.

8. The method of claim 1, wherein the memory comprises a code table.

9. The method of claim 1, wherein the code is provided as an output for the compression.

10. A non-transitory computer-readable medium storing a plurality of instructions which, when executed by a processor, cause the processor to perform operations for implementing a compression, the operations comprising:

receiving a first portion of an input data at a first register;

determining a first address based upon the first portion of the input data;

reading the first address in a memory to determine if a value stored in the first address is zero;

storing a code for the first address of the memory in the first register if the value of the first address is zero;

receiving a second portion of the input data at a second register;

determining a second address based upon the second portion of the input data in the memory;

obtaining the code from the first register if the second address and the first address are the same; and writing the code from the first register in the first address of the memory.

11. The non-transitory computer-readable medium of claim 10, further comprising:

reading the second address in the memory to determine if a value stored in the second address is zero if the first address and the second address are different; and storing a new code for the second address of the memory in the second register if the value of the second address is zero.

12. The non-transitory computer-readable medium of claim 10, wherein the operations repeated until a number of unique codes exceeds a number of unique combinations based upon a number of bits of the memory.

13. The non-transitory computer-readable medium of claim 12, comprising:

resetting each address of the memory to a value of zero when the number of unique codes exceeds the number of unique combinations based upon a number of bits of the memory and repeating the operations.

14. The non-transitory computer-readable medium of claim 12, comprising a first flag table and a second flag table, wherein each address of the first flag table and the second flag table comprises a single bit, wherein the first flag table and the second flag table are used to track whether an address of each portion of the input data that is received has been seen by a code table.

15. The non-transitory computer-readable medium of claim 14, comprising:

using the first flag table for each portion of the input data that is received; and using the second flag table once the unique codes exceeds the number of unique combinations based upon a number of bits of the memory for each subsequent portion of the input data that is received while the first flag table is reset.

16. The non-transitory computer-readable medium of claim 10, wherein each subsequent portion of the input data alternates between the first register and the second register.

17. The non-transitory computer-readable medium of claim 10, wherein the memory comprises a code table.

18. The non-transitory computer-readable medium of claim 10, wherein the code is provided as an output for the dictionary based lossless compression.

19. A method for implementing a compression, comprising:

receiving, by a processor, a first portion of an input data at a first register during a first clock cycle;

determining, by the processor, a first address based upon the first portion of the input data;

reading, by the processor, the first address in a first flag table to determine if a value stored in the first address is zero;

storing, by the processor, a code for the first address in the first register if the value is zero;

receiving, by the processor, a second portion of the input data at a second register during a second clock cycle;

determining, by the processor, a second address based upon the second portion of the input data;

obtaining, by the processor, the code from the first register if the second address and the first address are the same;

writing, by the processor, a value of one in the first address of the first flag table and the code from the first register in the first address of a code table during the second clock cycle; and incrementing, by the processor, a value of a next code counter parameter.

20. The method of claim 19, further comprising:

determining, by the processor, that the value of the next code counter parameter exceeds a threshold;

reading a respective address of each subsequent portion of the input data in a second flag table; and resetting a respective value stored in each address in the first flag table to zero.

* * * * *